(12) United States Patent
Matsumoto et al.

(10) Patent No.: US 11,521,845 B2
(45) Date of Patent: Dec. 6, 2022

(54) LAMP DEVICE, EXPOSURE APPARATUS, AND METHOD OF MANUFACTURING ARTICLE

(71) Applicant: CANON KABUSHIKI KAISHA, Tokyo (JP)

(72) Inventors: Hideki Matsumoto, Utsunomiya (JP); Yasushi Sugiyama, Shimotsuke (JP); Kohei Suzuki, Utsunomiya (JP); Yukihiro Yokota, Utsunomiya (JP); Shunsuke Ota, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 72 days.

(21) Appl. No.: 17/018,092

(22) Filed: Sep. 11, 2020

(65) Prior Publication Data
US 2021/0082682 A1    Mar. 18, 2021

(30) Foreign Application Priority Data
Sep. 17, 2019    (JP) .............................. JP2019-168732

(51) Int. Cl.
*H01J 61/28*    (2006.01)
*H01J 61/32*    (2006.01)
(Continued)

(52) U.S. Cl.
CPC .......... *H01J 61/28* (2013.01); *G03F 7/70016* (2013.01); *H01J 61/20* (2013.01);
(Continued)

(58) Field of Classification Search
CPC .......... H01J 61/28; H01J 61/20; H01J 61/302; H01J 61/32; H01J 61/366; H01J 5/54;
(Continued)

(56) References Cited

U.S. PATENT DOCUMENTS

2001/0010447 A1 * 8/2001 Yamane .............. H01J 61/0732
                                                              313/623
2002/0145875 A1 * 10/2002 Roberts .................. F21V 25/04
                                                              362/264

FOREIGN PATENT DOCUMENTS

JP    H01246704 A  * 10/1989    .............. F21V 30/00
JP    2003297228 A    10/2003
(Continued)

OTHER PUBLICATIONS

Office Action issued by Taiwan Office Action in corresponding TW Patent Application No. 109130361, dated Sep. 27, 2022, together with English translation.

*Primary Examiner* — Donald L Raleigh
(74) *Attorney, Agent, or Firm* — Carter, DeLuca & Farrell LLP

(57) ABSTRACT

The present invention provides a lamp device comprising: a glass tube configured to cover a discharge space in which a pair of electrodes are arranged so as to face each other; and a bayonet cap portion provided in an end portion of the glass tube and electrically connected to one electrode of the pair of electrodes, wherein the bayonet cap portion is formed to have a shape including a bottom surface and a peripheral surface, and includes, in the bottom surface, a first opening configured to supply a gas to an inside of the bayonet cap portion and a second opening configured to exhaust the gas from the inside of the bayonet cap portion.

18 Claims, 8 Drawing Sheets

(51) Int. Cl.
  *G03F 7/20* (2006.01)
  *H01J 61/36* (2006.01)
  *H01J 61/30* (2006.01)
  *H01J 61/20* (2006.01)
(52) U.S. Cl.
  CPC ............ *H01J 61/302* (2013.01); *H01J 61/32* (2013.01); *H01J 61/366* (2013.01)
(58) Field of Classification Search
  CPC ...... H01J 61/52; H01J 61/822; H01J 61/0732; H01J 61/523; G03F 7/70016; H01L 21/027
  See application file for complete search history.

(56) References Cited

FOREIGN PATENT DOCUMENTS

| | | |
|---|---|---|
| JP | 2004127665 A | 4/2004 |
| JP | 3606149 B2 | 1/2005 |
| JP | 2017152291 A | 8/2017 |
| TW | 201324584 A | 6/2013 |
| TW | 201730926 A | 9/2017 |

\* cited by examiner

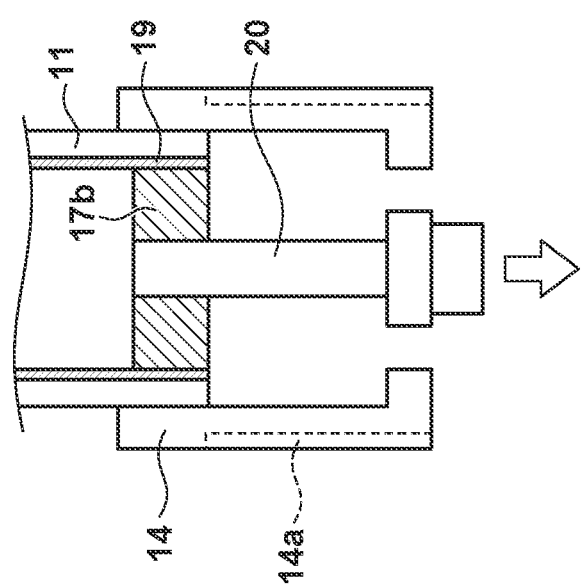
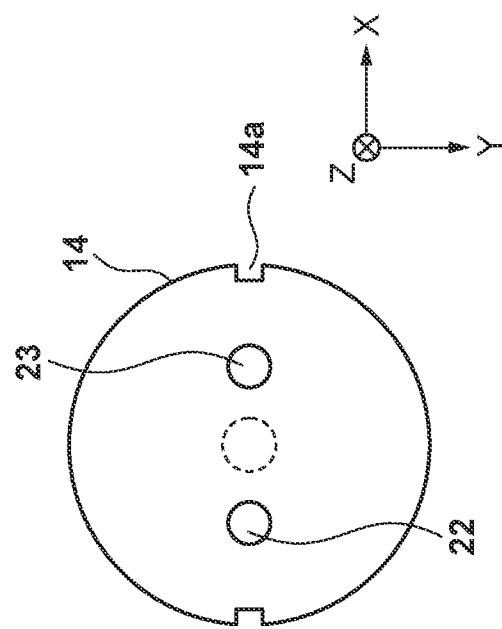
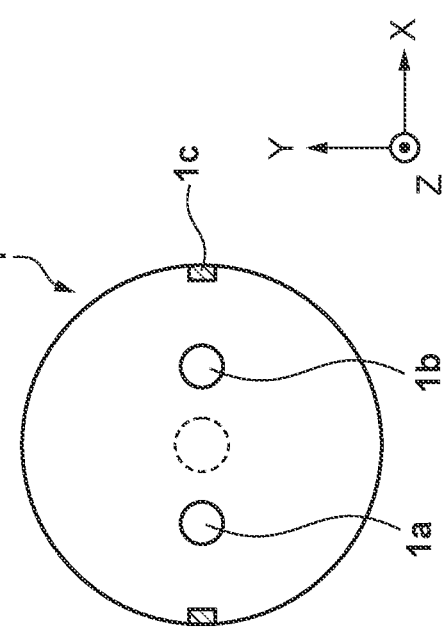

LAMP DEVICE, EXPOSURE APPARATUS, AND METHOD OF MANUFACTURING ARTICLE

BACKGROUND OF THE INVENTION

Field of the Invention

The present invention relates to a lamp device, an exposure apparatus, and a method of manufacturing an article.

Description of the Related Art

An exposure apparatus that exposes a substrate is one of apparatuses used in the manufacturing step (lithography step) of a semiconductor device or the like. The exposure apparatus can transfer a pattern formed on a mask to a photosensitive material (resist) on a substrate by projecting the image of the pattern of the mask onto the photosensitive material on the substrate via a projection optical system. For example, when the substrate (photosensitive material) is exposed using light (i-line) having a wavelength of 365 nm, a mercury lamp can be used as a light source in the exposure apparatus.

For example, the mercury lamp has a structure in which a pair of electrodes are arranged so as to face each other in a glass tube in which mercury is sealed, and a bayonet cap portion is provided in each of the both end portions of the glass tube. Each end portion of the glass tube is sealed by enclosing a glass sealing member having a diameter almost the same as the inner diameter of the glass tube, and an electrically conductive member (for example, a metal foil) that electrically connects the electrode and the bayonet cap portion is arranged between the sealing member and the glass tube. With this arrangement, it is possible to electrically connect the electrode and the bayonet cap portion while keeping the inside of the glass tube in an airtight state.

It is known that the temperature of the mercury lamp becomes very high while it is turned on, so that if its component is thermally deformed due to the influence of the very high temperature, a gap is formed between the sealing member and the glass tube and air enters through the gap, causing the electrically conductive member to be oxidized. Such thermal deformation or oxidization causes a conduction failure or breakage of the glass tube, which shortens the life of the mercury lamp. Therefore, in the mercury lamp, it is desired to efficiently cool the end portion (for example, the electrically conductive member) of the glass tube. Japanese Patent No. 3606149 discloses an arrangement in which a first opening for allowing a gas to flow to the inside of a bayonet cap is provided in the peripheral surface (side surface) of the bayonet cap, and a second opening for allowing the gas to flow out from the inside of the bayonet cap is provided in the bottom surface of the bayonet cap.

Since the temperature of the mercury lamp becomes very high while it is turned on, the temperature of the gas around it can also rise. Therefore, as described in Japanese Patent No. 3606149, the arrangement in which the first opening provided in the peripheral surface (side surface) of the bayonet cap allows the gas to flow to the inside of the bayonet cap results in allowing the high temperature gas to flow to the inside of the bayonet cap, so that the cooling efficiency can become insufficient.

SUMMARY OF THE INVENTION

The present invention provides, for example, a lamp device advantageous in cooling efficiency.

According to one aspect of the present invention, there is provided a lamp device comprising: a glass tube configured to cover a discharge space in which a pair of electrodes are arranged so as to face each other; and a bayonet cap portion provided in an end portion of the glass tube and electrically connected to one electrode of the pair of electrodes, wherein the bayonet cap portion is formed to have a shape including a bottom surface and a peripheral surface, and includes, in the bottom surface, a first opening configured to supply a gas to an inside of the bayonet cap portion and a second opening configured to exhaust the gas from the inside of the bayonet cap portion.

Further features of the present invention will become apparent from the following description of exemplary embodiments with reference to the attached drawings.

BRIEF DESCRIPTION OF THE DRAWINGS

FIGS. 5A to 5C are views showing an example of an alignment portion between a holding portion of the exposure apparatus and the first bayonet cap portion of the lamp device;

DESCRIPTION OF THE EMBODIMENTS

Figure 1:
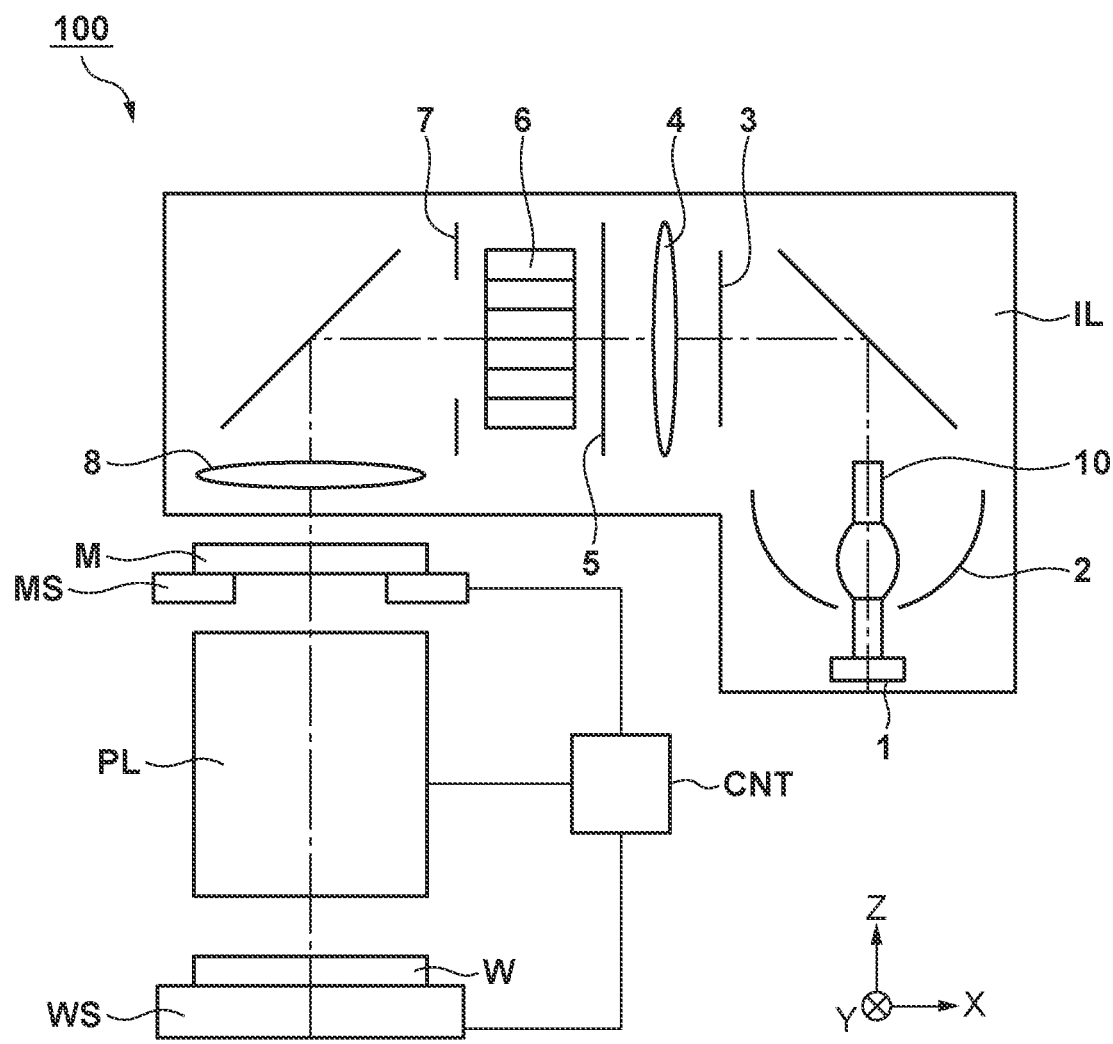
FIG. 1 is a schematic view showing an arrangement example of an exposure apparatus.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

First Embodiment

The first embodiment according to the present invention will be described. FIG. 1 is a schematic view showing an arrangement example of an exposure apparatus 100 of the first embodiment. The exposure apparatus 100 of the first embodiment can include, for example, an illumination optical system IL, a mask stage MS that holds a mask M (reticle), a projection optical system PL, a substrate stage WS that holds a substrate W (wafer), and a control unit CNT.

The exposure apparatus 100 performs a process (exposure process) in which the image of the pattern of the mask M is projected onto the substrate and the substrate W is exposed. The illumination optical system IL illuminates the mask M held by the mask stage MS. The projection optical system PL has a predetermined projection magnification, and projects the pattern of the mask M onto the substrate W. The control unit CNT is formed by, for example, a computer including a CPU, a memory, and the like, and controls the respective units of the exposure apparatus 100 (controls the exposure process).

Next, the arrangement of the illumination optical system IL will be described. The illumination optical system IL can include, for example, a holding portion 1 (holding device) that holds a lamp device 10, a concave mirror 2, an ND filter 3, a condenser lens 4, a wavelength filter 5, a fly-eye lens 6, a masking blade 7, and a lens 8. The holding portion 1 holds the lamp device 10 that emits light such as an i-line, for example. In this embodiment, an example will be described in which a mercury lamp is used as the lamp device 10, but a lamp other than the mercury lamp may be used as the lamp device 10. Light emitted from the lamp device 10 held by the holding portion 1 is condensed by the concave mirror 2, the light intensity is adjusted by the ND filter 3, and then the light is condensed by the condenser lens 4 and enters the wavelength filter 5. The wavelength filter 5 transmits light having a wavelength within a desired range. The light transmitted through the wavelength filter 5 has its light intensity distribution made uniform by the fly-eye lens 6, and is applied to the mask M via the masking blade 7 and the lens 8.

Arrangement of Lamp Device

Figure 2:
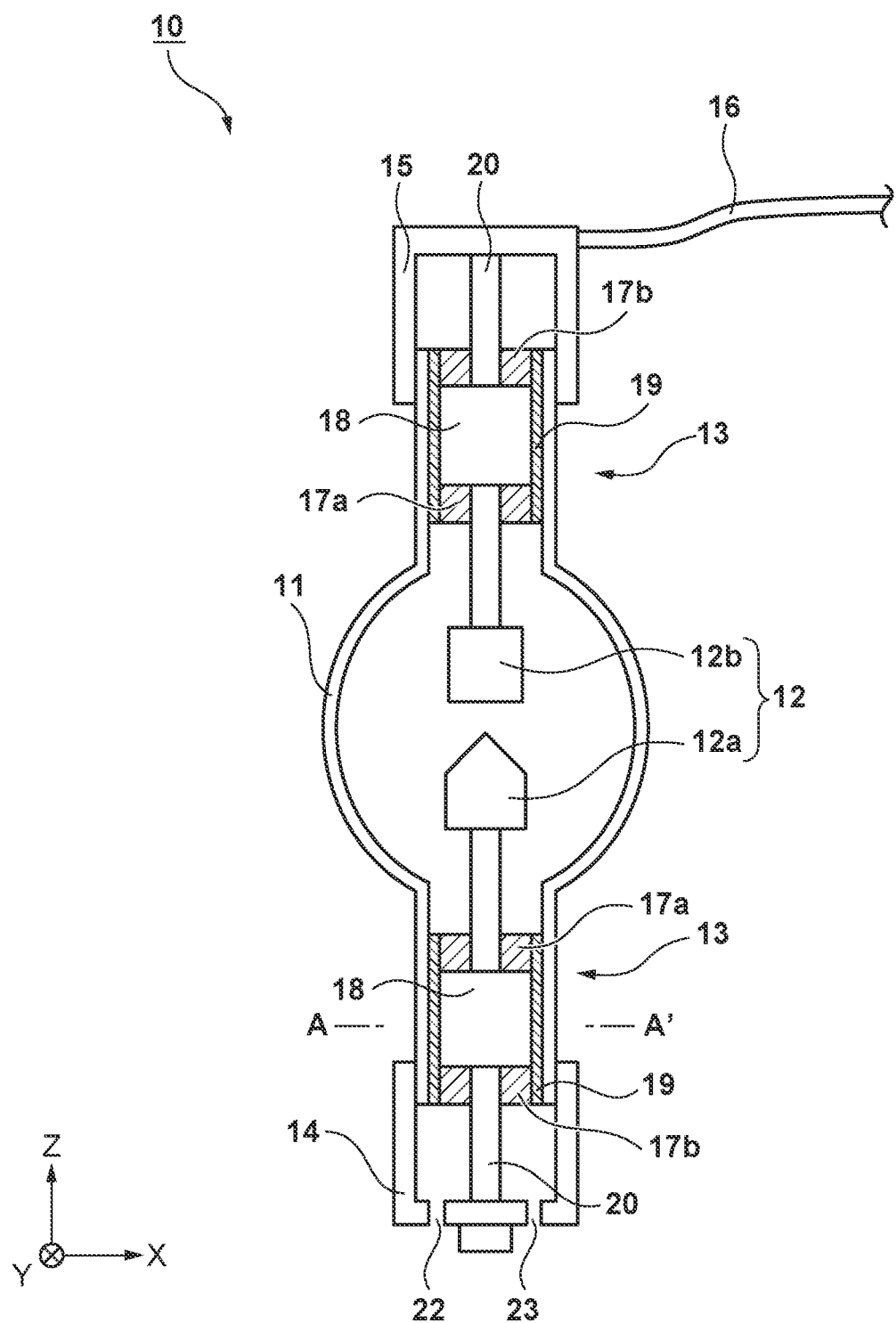
FIG. 2 is a view showing an arrangement example of a lamp device.
Figure 3:
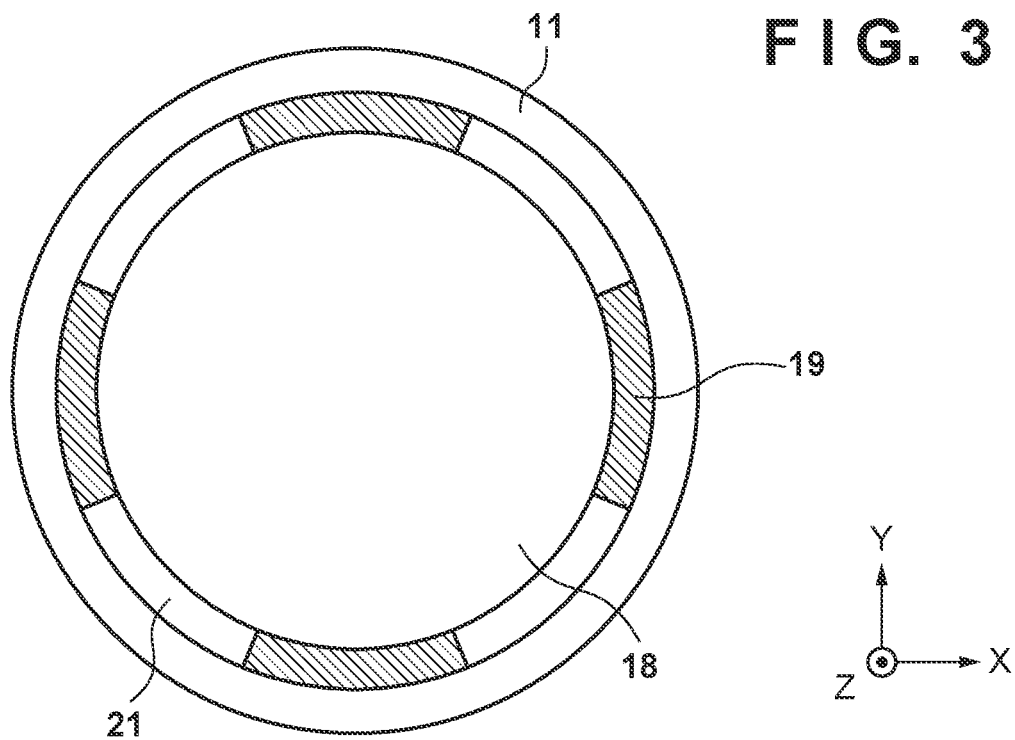
FIG. 3 is a view (a sectional view taken along a line A-A' in FIG. 2) showing the arrangement example of the lamp device.

Next, an arrangement example of the lamp device 10 of this embodiment will be described with reference to FIGS. 2 and 3. FIG. 2 is a view showing the arrangement example of the lamp device 10 of this embodiment. FIG. 3 is a sectional view taken along a line A-A' in FIG. 2. The lamp device 10 of this embodiment includes, for example, a pair of electrodes 12, a glass tube 11, sealing portions 13, and bayonet cap portions (a first bayonet cap portion 14 and a second bayonet cap portion 15), and emits light when a high voltage is applied to the pair of electrodes 12 via the bayonet cap portions.

The glass tube 11 is made of, for example, silica glass, and is configured to cover a discharge space in which the pair of electrodes 12 are arranged so as to face each other. Mercury is sealed inside the glass tube 11. Each of the both end portions of the glass tube 11 is sealed by the sealing portion 13, and the bayonet cap portion (the first bayonet cap portion 14 or the second bayonet cap portion 15) is provided therein. In this embodiment, each bayonet cap portion is formed to have a shape (a columnar shape (cylindrical shape) or a cap shape) including a bottom surface and a peripheral surface. The bottom surface is a surface on the side opposite to the glass tube 11, and the peripheral surface is a surface (side surface) surrounding the space between the bottom surface and the glass tube 11. The first bayonet cap portion 14 is electrically connected to one electrode 12a of the pair of electrodes 12 via the sealing portion 13, and held by the holding portion 1 of the exposure apparatus 100. The second bayonet cap portion 15 is electrically connected to the other electrode 12b of the pair of electrodes 12 via the sealing portion 13, and provided with a lead wire 16.

The sealing portion 13 has a diameter almost the same as the inner diameter of the glass tube 11, and is enclosed (inserted) in each of the both end portions of the glass tube 11 so as to keep the inside (discharge space) of the glass tube 11 in an airtight state. In this embodiment, the sealing portions 13 have similar arrangements in the both end portions of the glass tube 11, and each sealing portion 13 can include, for example, a first holding body 17a, a second holding body 17b, a sealing member 18, an electrically conductive member 19, and a lead rod 20.

The first holding body 17a and the second holding body 17b are formed of an electrically conductive material such as a metal, and arranged so as to sandwich the sealing member 18 such as silica glass. The first holding body 17a holds the electrode (12a or 12b), and the second holding body 17b holds the lead rod 20 formed of an electrically conductive material such as a metal. The lead rod 20 is electrically connected to the bayonet cap portion (the first bayonet cap portion 14 or the second bayonet cap portion 15).

The electrically conductive member 19 is a metal foil formed of an electrically conductive material such as a metal (molybdenum) in a foil shape, and partially arranged on the inner surface of the glass tube 11 (that is, between the glass tube 11 and the sealing member 18) so as to electrically connect the first holding body 17a and the second holding body 17b. As an example, as shown in FIG. 3, the electrically conductive members 19 (metal foils) are arranged at a plurality of positions spaced apart in the circumferential direction (the rotation direction around the Z-axis) of the glass tube 11 between the glass tube 11 and the sealing member 18. In the example shown in FIG. 3, the electrically conductive members 19 are arranged at four positions spaced apart in the circumferential direction of the glass tube 11. A sealing material 21 (adhesive) is provided at a position between the glass tube 11 and the sealing member 18 at which no electrically conductive member 19 is arranged. By arranging the sealing portions 13 as described above, it is possible to electrically connect the pair of electrodes 12 and the bayonet cap portions (the first bayonet cap portion 14 and the second bayonet cap portion 15) while keeping the inside (discharge space) of the glass tube 11 in the airtight state.

Cooling of Lamp Device

The lamp device 10 is a consumable part, and needs to be replaced periodically. However, it takes a certain amount of time to replace the lamp device 10, and the operation of the exposure apparatus 100 is stopped during that time. Accordingly, the lamp device 10 is desired to have a long life. There are a plurality of factors that shorten the life of the lamp device 10, such as distortion and dirt of the glass tube 11 and deformation of the tip shape of the electrode, and one of the major factors is the influence of thermal deformation in the sealing portion 13 and its surroundings. For example, the thermal expansion coefficient of the electrically conductive material such as a metal forming the electrically conductive member 19 (a metal foil) is different from that of the material such as silica glass forming the glass tube 11 and the sealing member 18. Accordingly, when the lamp device 10 is turned on and its temperature becomes high, a gap is formed between the glass tube 11 and the sealing portion 13 due to a difference in thermal expansion between these materials. If air enters through the gap, the electrically conductive member 19 is oxidized. Such thermal deformation or oxidation causes a conduction failure or breakage of the glass tube 11, which shortens the life of the lamp device 10. Therefore, in the lamp device 10, it is desired to efficiently cool the end portion of the glass tube 11 (for example, the second holding body 17b and the electrically conductive member 19 of the sealing portion 13).

As described in Japanese Patent No. 3606149, the arrangement in which a gas is allowed to flow to the inside of the bayonet cap portion through the opening provided in the peripheral surface (side surface) of the bayonet cap portion results in allowing the gas having reached a high temperature around the lamp device to flow to the inside of the bayonet cap, so that the cooling efficiency can become insufficient. On the other hand, in the arrangement described in Japanese Patent No. 3606149, a method is also conceivable in which a gas is allowed to flow to the inside of the bayonet cap portion through the opening provided in the bottom surface of the bayonet cap portion and flow out through the opening provided in the peripheral surface of the bayonet cap portion. However, this method can cause the following problems.

(1) Insufficient Cooling of Desired Portion

Due to the pressure difference and temperature difference between the inside and the outside of the bayonet cap portion, most of the gas flowing in through the opening provided in the bottom surface of the bayonet cap portion flows out through the opening provided in the peripheral surface of the bayonet cap portion. That is, it becomes difficult to control the gas flow inside the bayonet cap portion, so that it can become insufficient to efficiently apply the gas to the desired portion (sealing portion) to cool it.

(2) Scattering of Foreign Substance to Outside of Lamp Device

A material such as the sealing material (adhesive) is used in the sealing portion, and a fragment of the material may be generated as a foreign substance inside the bayonet cap portion due to various factors. In this case, in the arrangement in which the gas is allowed to flow out through the opening provided in the peripheral surface of the bayonet cap portion, the fragment (foreign substance) can be scattered to the outside of the lamp device and adhere to the outer wall of the glass tube around the pair of electrodes.

Therefore, in the lamp device 10 of this embodiment, a first opening 22 for supplying a gas to the inside of the first bayonet cap portion 14 and a second opening 23 for exhausting the gas from the inside of the first bayonet cap portion 14 are provided in the bottom surface (the surface on the side opposite to the glass tube 11) of the first bayonet cap portion 14. Here, the bottom surface of the first bayonet cap portion 14 in which the first opening 22 and the second opening 23 are provided is, for example, the held surface (that is, a contact surface in contact with the holding portion 1) held by the holding portion 1 of the exposure apparatus 100. With this arrangement, in addition possible solution of the above-described problems (1) and (2), it is possible to efficiently cool the end portion of the glass tube 11 (for example, the second holding body 17b and the electrically conductive member 19 of the sealing portion 13). The detailed arrangement of the first bayonet cap portion 14 according to this embodiment will be described below.

Arrangement of First Bayonet Cap Portion

Figure 4:
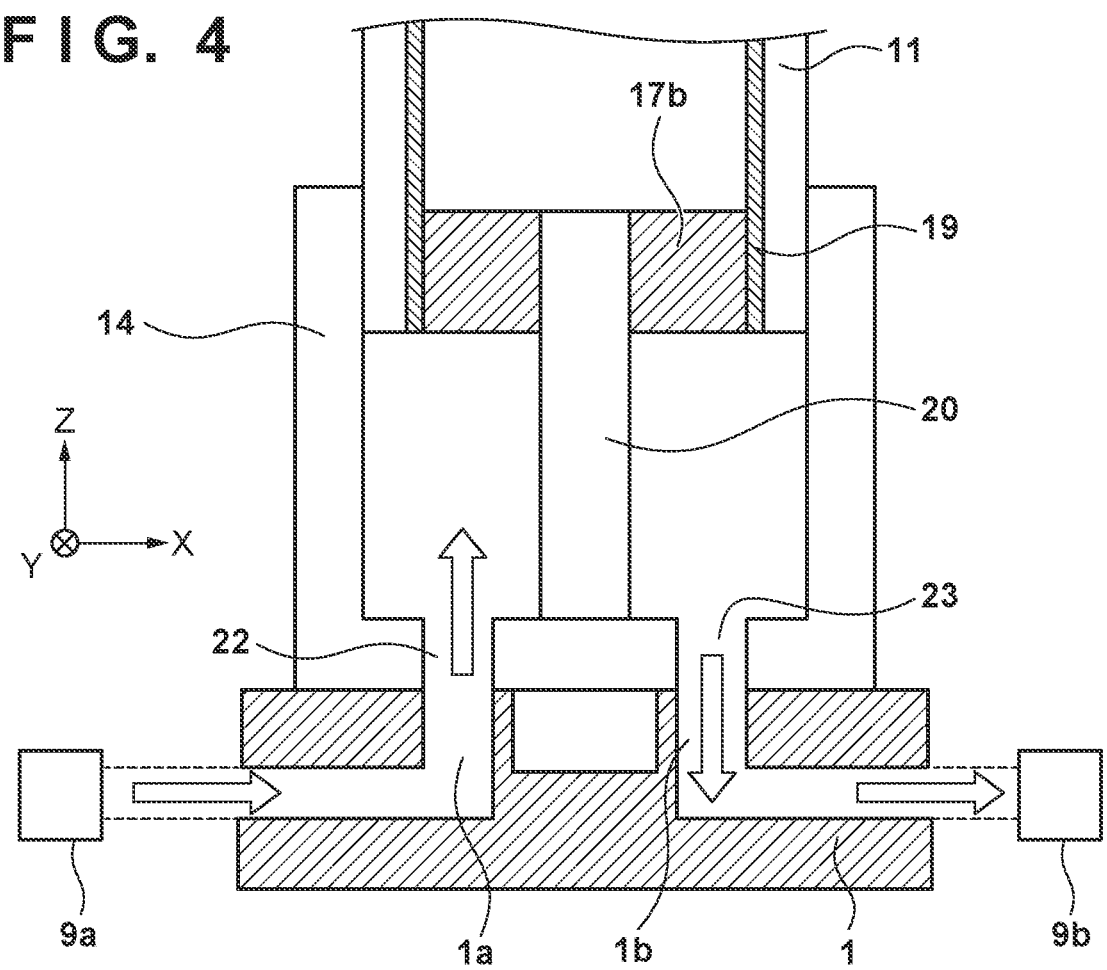
FIG. 4 is a view showing an arrangement example of a first bayonet cap portion of the lamp device.

FIG. 4 is a view showing an arrangement example of the first bayonet cap portion 14 of the lamp device 10. FIG. 4 shows the Z-X sectional view of a portion of the holding portion 1, the first bayonet cap portion 14 of the lamp, and its surroundings (a portion of the glass tube 11 and the sealing portion 13) in a state in which the lamp device 10 is held by the holding portion 1 of the exposure apparatus 100.

The holding portion 1 of the exposure apparatus 100 includes a gas supply port (inlet) 1a and a gas exhaust port (outlet) 1b in the holding surface (the contacted surface with which the first bayonet cap portion 14 of the lamp device 10 is in contact) for holding the lamp device 10. The gas supply port 1a communicates with a supply mechanism 9a that supplies a gas, and the gas exhaust port 1b communicates with an exhaust mechanism 9b that exhausts the gas. In this embodiment, both the supply mechanism 9a and the exhaust mechanism 9b are provided, but only one of them may be provided. In addition, the supply mechanism 9a and the exhaust mechanism 9b may be the components of the exposure apparatus 100, or may not be the components of the exposure apparatus 100. When they are the components of the exposure apparatus 100, they can be controlled by the control unit CNT. On the other hand, when they are not the components of the exposure apparatus 100, the supply mechanism 9a and the exhaust mechanism 9b can be, for example, equipments in a clean room in which the exposure apparatus 100 is installed.

The first bayonet cap portion 14 of the lamp device 10 includes the first opening 22 and the second opening 23 in the bottom surface serving as the held surface which is held by the holding portion 1 of the exposure apparatus 100. The first opening 22 is formed in the bottom surface at a position overlapping with the gas supply port 1a of the holding portion 1, and the second opening 23 is formed in the bottom surface at a position overlapping with the gas exhaust port 1b of the holding portion 1. With this arrangement, it is possible to form a gas flow indicated by arrows in FIG. 4 and efficiently cool the sealing portion 13 (for example, the second holding body 17b and the electrically conductive member 19).

Next, an alignment portion for aligning the first bayonet cap portion 14 (the first opening 22 and the second opening 23) of the lamp device 10 with the holding portion 1 (the gas supply port 1a and the gas exhaust port 1b) of the exposure apparatus 100 will be described. FIGS. 5A to 5C are views showing an example of the alignment portion between the holding portion 1 of the exposure apparatus 100 and the first bayonet cap portion 14 of the lamp device 10. FIG. 5A is a Z-X sectional view of the first bayonet cap portion 14 and the holding portion 1, FIG. 5B is a view of the first bayonet cap portion 14 when viewed from the −Z direction, and FIG. 5C is a view of the holding portion 1 when viewed from the +Z direction. For example, the alignment portion can include concave groove portions 14a formed in the outer peripheral surface of the first bayonet cap portion 14 of the lamp device 10 and convex guide portions 1c provided in the holding portion 1 of the exposure apparatus 100. When the first bayonet cap portion 14 is attached to the holding portion 1, each groove portion 14a of the first bayonet cap portion 14 is fitted in each guide portion 1c of the holding portion 1. Thus, the first opening 22 and the second opening 23 of the first bayonet cap portion 14 can be positioned with respect to the gas supply port 1a and the gas exhaust port 1b of the holding portion 1, respectively. In this embodiment, the convex guide portions 1c are provided in the holding portion 1 and the concave groove portions 14a are provided in the first bayonet cap portion 14. However, the present invention is not limited to this, and concave groove portions may be provided in the holding portion 1 and convex guide portions may be provided in the first bayonet cap portion 14. Note that the alignment is performed using the structure of the outer peripheral surface of the first bayonet cap portion 14 and the structure of the holding portion 1, but the present invention is not limited to this. The alignment may be performed using the structure of the bottom portion of the first bayonet cap portion 14. Instead of or in addition to the engagement using the concave and convex structures, the lamp device 10 may be provided with an identifier (for example, a mark) capable of identifying the circumferential position to position the first opening 22 and the second opening 23.

Figure 6:
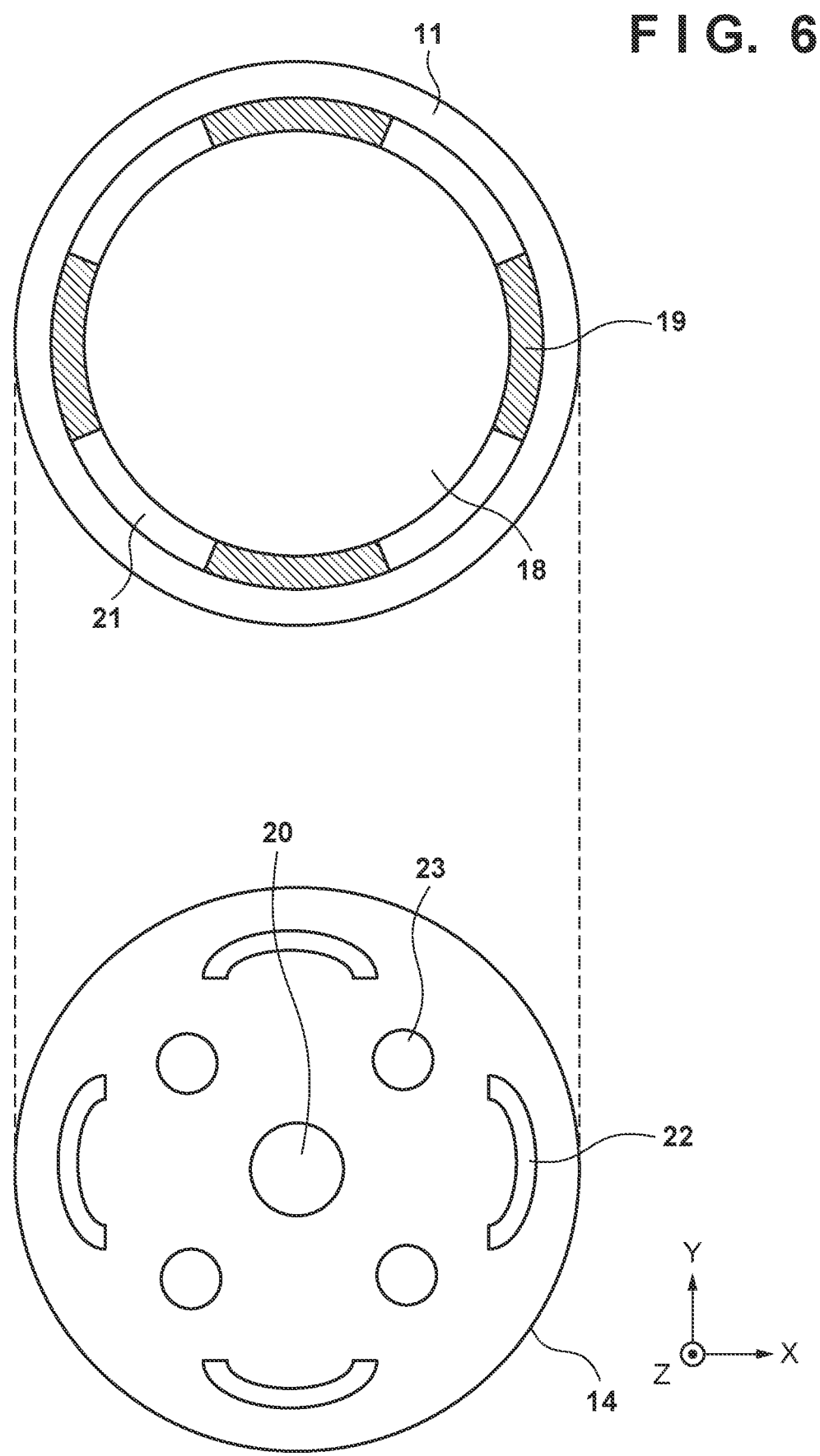
FIG. 6 is a view showing an arrangement example of first openings and second openings in the first bayonet cap portion.

Here, in the example described above, the one first opening 22 (gas supply port 1a) is provided in the bottom surface of the first bayonet cap portion 14, but the present invention is not limited to this, and a plurality of the first openings 22 may be provided at a plurality of positions on the bottom surface of the first bayonet cap portion 14 so as to correspond to the positions of the cooling target portions in the lamp device 10. For example, when the cooling target is the electrically conductive member 19 (a metal foil), each first opening 22 can be arranged at a position overlapping with each electrically conductive member 19 in the circumferential direction (the rotation direction around the Z-axis) of the glass tube 11 as shown in FIG. 6. FIG. 6 is a view showing an arrangement example of the first openings 22 and the second openings 23 in the first bayonet cap portion 14, and also shows the arrangement of the electrically conductive members 19 of the sealing portion 13 for comparison. In the example shown in FIG. 6, the four first openings 22 are provided in the bottom surface of the first bayonet cap portion 14 so as to correspond to the positions of the four electrically conductive members 19 spaced apart in the circumferential direction, and the shape of each first openings 22 is formed to be an arc shape so as to correspond to the shape of each electrically conductive member 19. The number and shape of the first openings 22 are not limited to the example shown in FIG. 6, and can be arbitrarily set as long as the sealing portion 13 (for example, the electrically conductive members 19) can be efficiently cooled.

Figure 7:
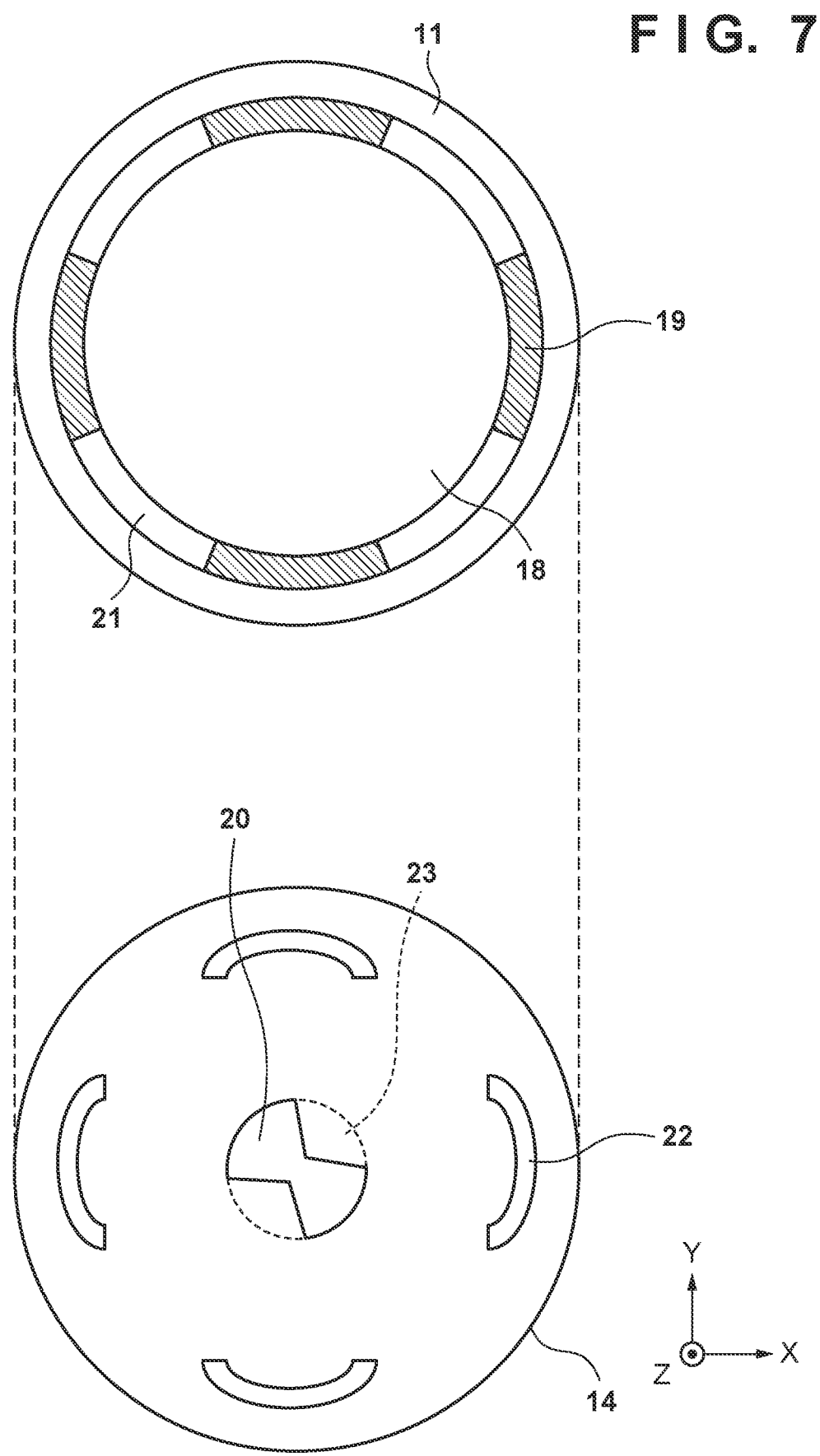
FIG. 7 is a view showing another arrangement example of the first openings and the second openings in the first bayonet cap portion.

In addition, in the example described above, the one second opening 23 (gas exhaust port 1b) is provided in the bottom surface of the first bayonet cap portion 14, but the present invention is not limited to this, and a plurality of the second openings 23 may be provided at a plurality of positions on the bottom surface of the first bayonet cap portion 14. For example, as shown in FIG. 6, the plurality of (four) second openings 23 each having a circular shape may be provided around the lead rod 20. The number and shape of the second openings 23 can be arbitrarily set as long as the sealing portion 13 can be efficiently cooled. As an example, as shown in FIG. 7, the lead rod 20 may be partially notched, and the second openings 23 may be provided in the notched portions. FIG. 7 is a view showing another arrangement example of the first openings 22 and the second openings 23 in the first bayonet cap portion 14, and also shows the arrangement of the electrically conductive members 19 of the sealing portion 13 for comparison.

As has been described above, the lamp device 10 of this embodiment is provided with the first opening 22 for supplying the gas to the inside of the first bayonet cap portion 14 and the second opening 23 for exhausting the gas from the inside of the first bayonet cap portion 14 in the bottom surface (the surface on the side opposite to the glass tube 11) of the first bayonet cap portion 14. With this arrangement, the end portion (for example, the second holding body 17b and the electrically conductive member 19 of the sealing portion 13) of the glass tube 11 can be efficiently cooled.

Figure 8:
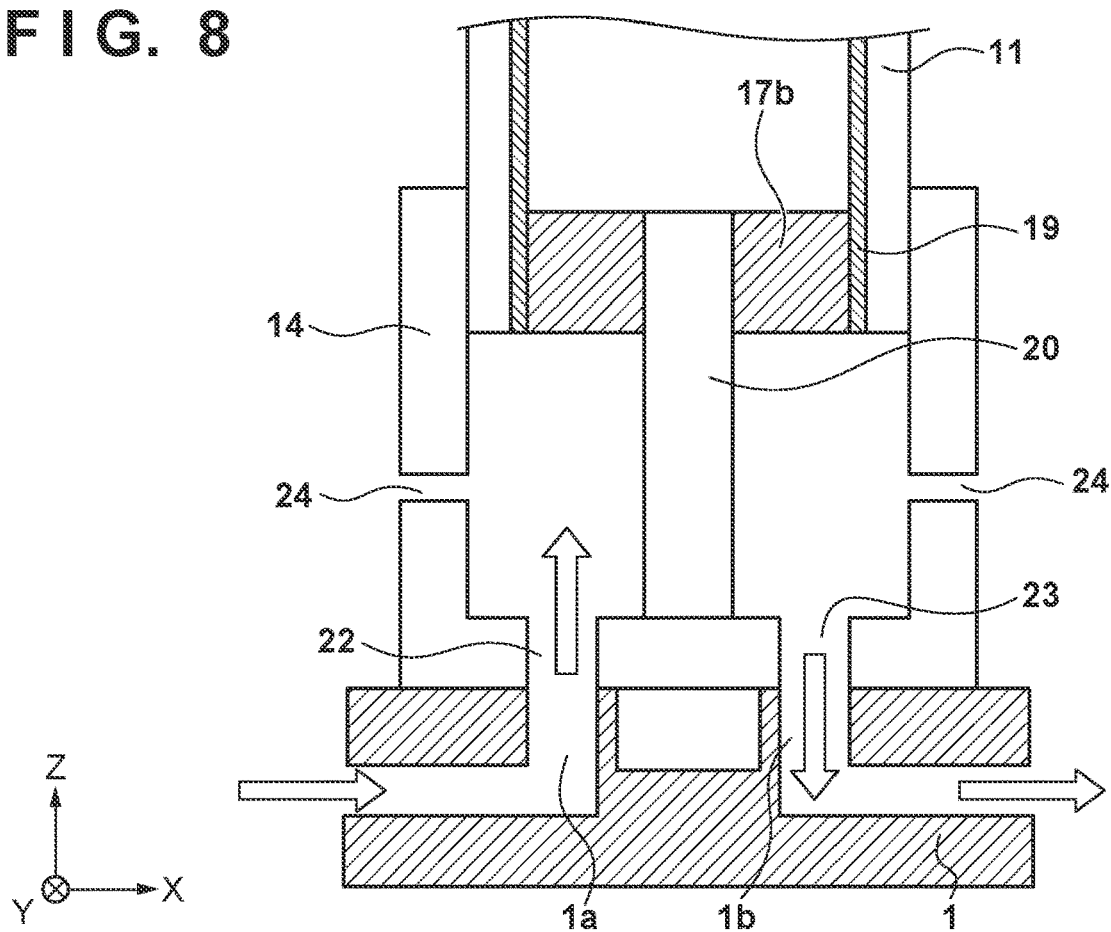
FIG. 8 is a view showing another arrangement example of the first bayonet cap portion of the lamp device.

Here, in the lamp device 10 of this embodiment, the first opening 22 and the second opening 23 are provided in only the bottom surface of the first bayonet cap portion 14, and no opening is provided in the peripheral surface of the first bayonet cap portion 14. However, the present invention is not limited to this. For example, as shown in FIG. 8, an opening (third opening 24) may be provided in the peripheral surface of the first bayonet cap portion 14. The third opening 24 can have the size smaller than the sizes of the first opening 22 and the second opening 23 such that the gas flow inside the first bayonet cap portion 14 formed by the gas supplied from the first opening 22 and the gas exhausted from the second opening 23 is not blocked. Note that when each of the first opening 22 and the third opening 24 includes a plurality of openings, the smaller size means that the total area of the plurality of openings included in the third opening 24 is smaller than the total area of the plurality of openings included in the first opening 22. Similarly, when each of the second opening 23 and the third opening 24 includes a plurality of openings, the smaller size means that the total area of the plurality of openings included in the third opening 24 is smaller than the total area of the plurality of openings included in the second opening 23. The third opening 24 is preferably as small as possible from the viewpoint of the inflow of the high-temperature gas around the lamp device described above (in paragraph 0021), and can serve as a safety valve when the balance between the gas supply and the gas exhaust is lost.

Further, in the lamp device 10 of this embodiment, the first opening 22 and the second opening 23 are provided in only the first bayonet cap portion 14, and the second bayonet cap portion 15 is provided with only the lead wire 16. However, the present invention is not limited to this. For example, the second bayonet cap portion 15 may also be configured to be provided with no lead wire 16 but be provided with the first opening 22 and the second opening 23 as in the first bayonet cap portion 14. In this case, a holding portion for holding the second bayonet cap portion 15 is provided in the exposure apparatus 100, and a gas supply port (inlet) and a gas exhaust port (outlet) can be provided in the holding portion. Note that the holding portion that holds the second bayonet cap portion 15 is preferably configured such that an area of blocking the optical path of light from the lamp is as small as possible.

Second Embodiment

Next, the second embodiment according to the present invention will be described. In the arrangement according to the first embodiment, when the plurality of the first openings 22 and the plurality of the second openings 23 are provided in the bottom surface of the first bayonet cap portion 14 of the lamp device 10, a plurality of the gas supply ports 1a and a plurality of the gas exhaust ports 1b need to be provided in the holding portion 1 of the exposure apparatus 100. In this case, a plurality of flow paths communicating with the plurality of the gas supply ports 1a and the plurality of the gas exhaust ports 1b need to be formed in the holding portion 1, which complicates the apparatus and may be disadvantageous in terms of the apparatus cost. Further, it becomes difficult (complicated) to change the arrangements or shapes of the first openings 22 and the second openings 23 to improve the performance of the lamp device 10, so that the degree of freedom in improving the lamp device 10 can be limited. Therefore, a lamp device 10 of this embodiment includes a storage portion 25 (gas waiting portion) that temporarily stores a gas supplied from first openings 22 to the inside of a first bayonet cap portion 14. Note that this embodiment basically takes over the first embodiment, unless otherwise specified.

Figure 9:
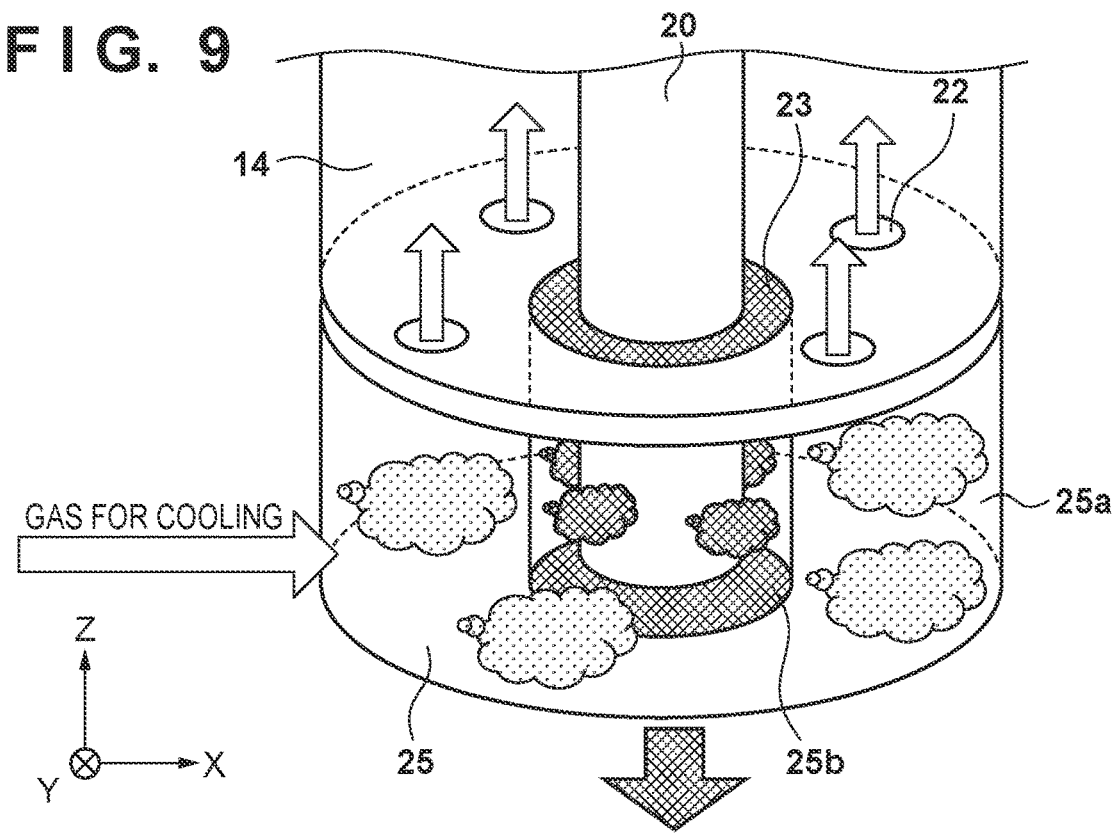
FIG. 9 is a view showing an arrangement example of a storage portion.

FIG. 9 is a view showing an arrangement example of the storage portion 25. FIG. 9 also shows a portion (a lead rod 20, the first openings 22, and a second opening 23) of the first bayonet cap portion 14. The storage portion 25 is configured to include a storage region 25a in which a gas supplied from a supply mechanism 9a is stored, and a flow path region 25b of the gas exhausted from the second opening 23 of the first bayonet cap portion 14 to an exhaust mechanism 9b. More specifically, the gas supplied from the supply mechanism 9a is temporarily stored in the storage region 25a of the storage portion 25, and then flows to the inside of the first bayonet cap portion 14 via the first openings 22. Thereafter, the gas inside the first bayonet cap portion 14 is exhausted via the second opening 23 and guided to the exhaust mechanism 9b through the flow path region 25b of the storage portion 25.

Next, an example of controlling gas supply/exhaust inside the first bayonet cap portion by the supply mechanism 9a and the exhaust mechanism 9b will be described. The supply mechanism 9a and the exhaust mechanism 9b can be controlled by a control unit CNT of an exposure apparatus 100. For example, the control unit CNT sets the supply mechanism 9a in an ON state and the exhaust mechanism 9b in an OFF state, thereby filling the storage region 25a of the storage portion 25 with the gas supplied from the supply mechanism 9a. Then, for example, when a predetermined time has elapsed and the storage region 25a is filled with the gas, the control unit CNT sets the exhaust mechanism 9b in an ON state, and exhausts the gas from the inside of the first bayonet cap portion 14 through the second opening 23 and the flow path region 25b of the storage portion 25.

By providing the storage portion 25 configured as described above in the lamp device 10, it is possible to reduce the complexity of the apparatus caused by forming the plurality of flow paths in a holding portion 1, and improve the degree of freedom in improving the lamp device 10. Here, in this embodiment, the storage portion 25 is provided in the lamp device 10, but it may be provided in the exposure apparatus 100 (holding portion 1). In this case, a gas supply port 1a can be provided in the storage portion 25.

Third Embodiment

Next, the third embodiment according to the present invention will be described. In this embodiment, an example of controlling gas supply to the inside of a first bayonet cap portion 14 by a supply mechanism 9a and gas exhaust from the inside of the first bayonet cap portion 14 by an exhaust mechanism 9b will be described. The supply mechanism 9a and the exhaust mechanism 9b can be controlled by a control unit CNT of an exposure apparatus 100. Note that this embodiment basically takes over the first embodiment, unless otherwise specified.

Figure 10A:
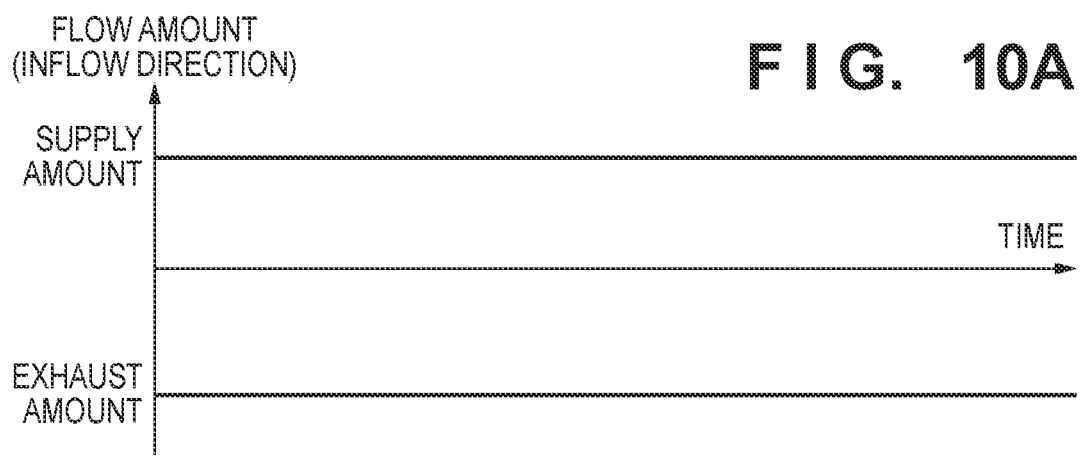
FIGS. 10A to 10C are timing charts each showing control of gas supply/exhaust inside a first bayonet cap portion.
Figure 10B:
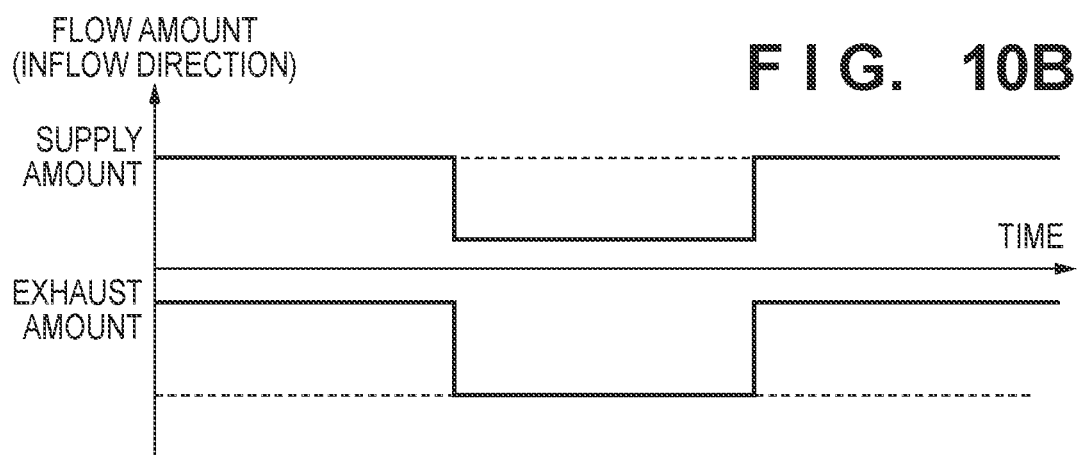
Figure 10C:
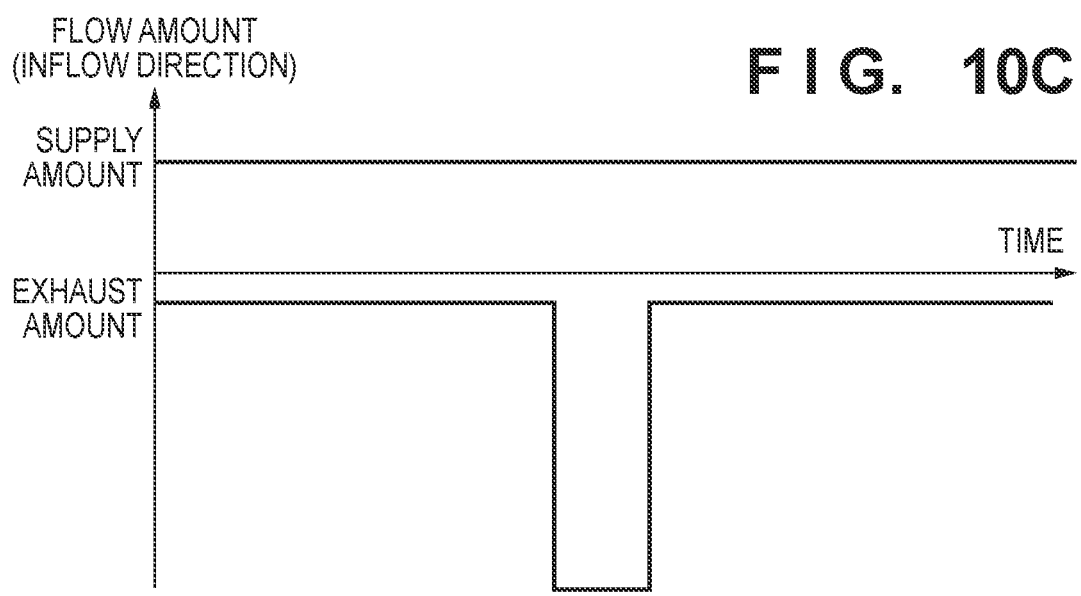

FIGS. 10A to 10C are timing charts each showing control of gas supply/exhaust inside the first bayonet cap portion 14. Each of FIGS. 10A to 10C shows a timing chart of the flow amount of the gas passing through a first opening 22 (that is, the supply amount of the gas to the inside of the first bayonet cap portion 14) and the flow amount of the gas passing through a second opening 23 (that is, the exhaust amount of the gas from the inside of the first bayonet cap portion 14). In each of FIGS. 10A to 10C, the abscissa represents time, and the ordinate represents the flow amount of the gas. Note that in the flow amount of the gas represented on the ordinate in each of FIGS. 10A to 10C, the direction of the gas flowing to the inside of the first bayonet cap portion 14 is represented as "+."

For example, as shown in FIG. 10A, the control unit CNT can control the supply mechanism 9a and the exhaust mechanism 9b such that the flow amount (supply amount) of the gas passing through the first opening 22 is constantly equal to the flow amount (exhaust amount) of the gas passing through the second opening 23. However, when the balance between the supply amount and the exhaust amount is lost, the flow amount (pressure) of the gas blown to the cooling target portion of the lamp device 10 changes, so the desired cooling effect cannot be obtained. This may cause breakage of the lamp device 10. Therefore, the control unit CNT monitors the supply amount by the supply mechanism 9a and the exhaust amount by the exhaust mechanism 9b and, when the balance therebetween is lost, the control unit CNT can give a notification (for example, a warning notification) or forcibly stop the operation of the apparatus.

Further, based on temperature information of the lamp device 10 detected by a temperature sensor or the like, the control unit CNT may intentionally change the balance between the supply amount and the exhaust amount such that the temperature of the lamp device 10 falls within an allowable range. As an example, when the gas flow is retained in a portion inside the first bayonet cap portion 14 so that the temperature of the lamp device 10 rises, the control unit CNT may change the balance between the supply amount and the exhaust amount as shown in FIG. 10B. With this operation, the retention of the gas flow can be eliminated. Further, when it is desired to improve the cooling efficiency while keeping the supply amount constant, the control unit CNT may temporarily increase the exhaust amount as shown in FIG. 10C.

Embodiment of Method of Manufacturing Article

A method of manufacturing an article according to an embodiment of the present invention is suitable for manufacturing an article, for example, a microdevice such as a semiconductor device or an element having a microstructure. The method of manufacturing the article according to this embodiment includes a step of forming, using the above-described exposure apparatus, a latent image pattern on a photosensitive agent applied to a substrate (a step of exposing the substrate), and a step of developing (processing) the substrate with the latent image pattern formed in the above step. This manufacturing method further includes other known steps (oxidation, deposition, vapor deposition, doping, planarization, etching, resist separation, dicing, bonding, packaging, and the like). The method of manufacturing the article according to this embodiment is advantageous in at least one of the performance, quality, productivity, and production cost of the article, as compared with a conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-168732 filed on Sep. 17, 2019, which is hereby incorporated by reference herein in its entirety.

What is claimed is:

1. A lamp device comprising:
a glass tube configured to cover a discharge space in which a pair of electrodes are arranged so as to face each other; and
a bayonet cap portion provided in an end portion of the glass tube and electrically connected to one electrode of the pair of electrodes,
wherein the bayonet cap portion is formed to have a shape including a bottom surface and a peripheral surface, and includes, in the bottom surface, a first opening configured to supply a gas to an inside of the bayonet cap portion and a second opening configured to exhaust the gas from the inside of the bayonet cap portion, and
wherein the bayonet cap portion include no opening in the peripheral surface.

2. The device according to claim 1, wherein
the bayonet cap portion includes a third opening in the peripheral surface, and
the third opening is smaller than the first opening and the second opening.

3. The device according to claim 1, wherein
the lamp device is held by a holding device including a gas supply port and a gas exhaust port,
the bayonet cap portion includes the first opening in the bottom surface at a position overlapping with the gas supply port and the second opening in the bottom surface at a position overlapping with the gas exhaust port in a state in which the lamp device is held by the holding device.

4. The device according to claim 3, further comprising an alignment portion configured to align the first opening and the second opening with the gas supply port and the gas exhaust port of the holding device, respectively.

5. The device according to claim 4, wherein the alignment portion includes one of a convex portion and a concave portion that is engaged with the holding device and defines a position in a circumferential direction.

6. The device according to claim 3, wherein the bottom surface of the bayonet cap portion is a held surface held by the holding device.

7. The device according to claim 1, further comprising a storage portion configured to temporarily store a gas supplied from the first opening to the inside of the bayonet cap portion.

8. The device according to claim 1, further comprising an electrically conductive member partially arranged on an inner surface of the glass tube and configured to connect the one electrode with the bayonet cap portion,
wherein the bayonet cap portion includes the first opening at a position overlapping with the electrically conductive member in a circumferential direction of the glass tube.

9. The device according to claim 1, wherein
mercury is sealed inside the glass tube, and
the lamp device further comprises a sealing portion configured to perform sealing so as to keep the inside of the glass tube in an airtight state.

10. The device according to claim 9, wherein the bayonet cap portion is electrically connected to the glass tube and the one electrode of the pair of electrodes via an electrically conductive material provided in the sealing portion.

11. The device according to claim 10, wherein a thermal expansion coefficient of the electrically conductive material is different from thermal expansion coefficients of the glass tube and the sealing portion.

12. The device according to claim 9, wherein the sealing portion seals the glass tube by being enclosed in the end portion of the glass tube.

13. An exposure apparatus that exposes a substrate, comprising:
a holding device configured to hold a lamp device defined in claim 1,
wherein the holding device includes a gas supply port configured to supply a gas to the inside of the bayonet cap portion in the lamp device via the first opening of the lamp device, and a gas exhaust port configured to exhaust the gas from the inside of the bayonet cap portion via the second opening of the lamp device.

14. The apparatus according to claim 13, further comprising a storage portion configured to temporarily store a gas supplied to the lamp device, wherein the gas exhaust port is provided in the storage portion.

15. The apparatus according to claim 13, further comprising a control unit configured to control a supply amount of a gas supplied to the inside of the bayonet cap portion via the first opening and an exhaust amount of the gas exhausted from the inside of the bayonet cap portion via the second opening.

16. A method of manufacturing an article, the method comprising;
exposing a substrate using an exposure apparatus; and
processing the substrate exposed in the exposing,
wherein the article is manufactured from the substrate processed in the processing,
wherein the exposure apparatus comprises a holding device configured to hold a lamp device,
wherein the holding device includes a gas supply port configured to supply a gas to an inside of a bayonet cap portion in the lamp device via a first opening of the lamp device, and a gas exhaust port configured to exhaust the gas from the inside of the bayonet cap portion via a second opening of the lamp device, and
wherein the lamp device comprises:
a glass tube configured to cover a discharge space in which a pair of electrodes are arranged so as to face each other; and
the bayonet cap portion provided in an end portion of the glass tube and electrically connected to one electrode of the pair of electrodes,
wherein the bayonet cap portion is formed to have a shape including a bottom surface and a peripheral surface, and includes, in the bottom surface, a first opening configured to supply a gas to an inside of the bayonet cap portion and a second opening configured to exhaust the gas from the inside of the bayonet cap portion.

17. A lamp device comprising:
a glass tube configured to cover a discharge space in which a pair of electrodes are arranged so as to face each other; and
a bayonet cap portion provided in an end portion of the glass tube and electrically connected to one electrode of the pair of electrodes,
wherein the bayonet cap portion is formed to have a shape including a bottom surface and a peripheral surface, and includes, in the bottom surface, a first opening configured to supply a gas to an inside of the bayonet cap portion and a second opening configured to exhaust the gas from the inside of the bayonet cap portion,
wherein the lamp device is held by a holding device including a gas supply port and a gas exhaust port, and
wherein the bayonet cap portion includes the first opening in the bottom surface at a position overlapping with the gas supply port and the second opening in the bottom surface at a position overlapping with the gas exhaust port in a state in which the lamp device is held by the holding device.

18. An exposure apparatus that exposes a substrate, comprising:

a holding device configured to hold a lamp device, wherein the lamp device comprises:

a glass tube configured to cover a discharge space in which a pair of electrodes are arranged so as to face each other; and a bayonet cap portion provided in an end portion of the glass tube and electrically connected to one electrode of the pair of electrodes, wherein the bayonet cap portion is formed to have a shape including a bottom surface and a peripheral surface, and includes, in the bottom surface, a first opening configured to supply a gas to an inside of the bayonet cap portion and a second opening configured to exhaust the gas from the inside of the bayonet cap portion, and wherein the holding device includes a gas supply port configured to supply a gas to the inside of the bayonet cap portion in the lamp device via the first opening of the lamp device, and a gas exhaust port configured to exhaust the gas from the inside of the bayonet cap portion via the second opening of the lamp device.

* * * * *